US012587220B2

(12) United States Patent     (10) Patent No.:   US 12,587,220 B2

Gunturi et al.     (45) Date of Patent:    Mar. 24, 2026

(54) DIGITAL PRE-DISTORTION CORRECTOR FOR POWER AMPLIFIER

(71) Applicant: TEXAS INSTRUMENTS INCORPORATED, Dallas, TX (US)

(72) Inventors: Sarma Sundareswara Gunturi, Bangalore (IN); Chandrasekhar Sriram, Bangalore (IN); Jawaharlal Tangudu, Bangalore (IN); Nishant Kumar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/437,719

(22) Filed: Feb. 9, 2024

(65) Prior Publication Data

US 2024/0305323 A1    Sep. 12, 2024

(30) Foreign Application Priority Data

Mar. 9, 2023   (IN) ............................. 202341015608

(51) Int. Cl.
   *H04B 1/04*      (2006.01)
   *H03F 1/32*      (2006.01)
   *H03F 3/24*      (2006.01)
(52) U.S. Cl.
   CPC ......... *H04B 1/0475* (2013.01); *H03F 1/3241* (2013.01); *H03F 3/245* (2013.01); *H03F 2200/451* (2013.01); *H04B 2001/0425* (2013.01)
(58) Field of Classification Search
   CPC .......... H04B 1/0475; H04B 2001/0425; H03F 1/3241; H03F 3/245; H03F 2200/451

USPC ......................................................... 375/297
See application file for complete search history.

(56) References Cited

U.S. PATENT DOCUMENTS

| | | | |
|---|---|---|---|
| 6,141,390 | A | 10/2000 | Cova |
| 8,229,025 | B1 | 7/2012 | Summerfield |
| 8,299,025 | B2 | 10/2012 | Alessi |
| 9,287,833 | B2 | 3/2016 | Peroulas |
| 10,931,238 | B2 | 2/2021 | Megretski |
| 11,171,614 | B2 | 11/2021 | Megretski |
| 11,251,819 | B1 * | 2/2022 | Zhao .................... H04B 1/0475 |

(Continued)

FOREIGN PATENT DOCUMENTS

| | | |
|---|---|---|
| GB | 2527816 B | 10/2018 |

OTHER PUBLICATIONS

U.S. Appl. No. 18/648,037 (Year: 2023).*

(Continued)

*Primary Examiner* — Kevin M Burd

(74) *Attorney, Agent, or Firm* — Xianghui Huang; Frank D. Cimino

(57) ABSTRACT

A circuit includes a first digital pre-distortion (DPD) corrector and a second DPD corrector. The first DPD corrector has an input, and an output. The second DPD corrector has an input coupled to the input of the first DPD corrector, and an output. A signal combiner has a first input coupled to the output of the first DPD corrector, a second input coupled to the output of the second DPD corrector, and an output. The second DPD corrector is configured to provide a signal at the output of the second DPD corrector based on a signal at the input of the second DPD corrector and one or more signal statistics related to the signal at the input of the second DPD corrector.

20 Claims, 7 Drawing Sheets

(56) References Cited

U.S. PATENT DOCUMENTS

| | | |
|---|---|---|
| 2002/0080891 A1 | 6/2002 | Ahn |
| 2010/0020900 A1* | 1/2010 | Cai ..................... H04L 27/2626 |
| | | 375/296 |
| 2014/0333377 A1 | 11/2014 | Peroulas |
| 2024/0364276 A1 | 10/2024 | Sriram |

OTHER PUBLICATIONS

Texas Instruments, "AFE77xxD Quad/Dual-Channel RF Transceiver With Dual Feedback Paths Integrating CFR/DPD," SBASAG3A—Jul. 2023, Revised Oct. 2023, 12 pages.

* cited by examiner

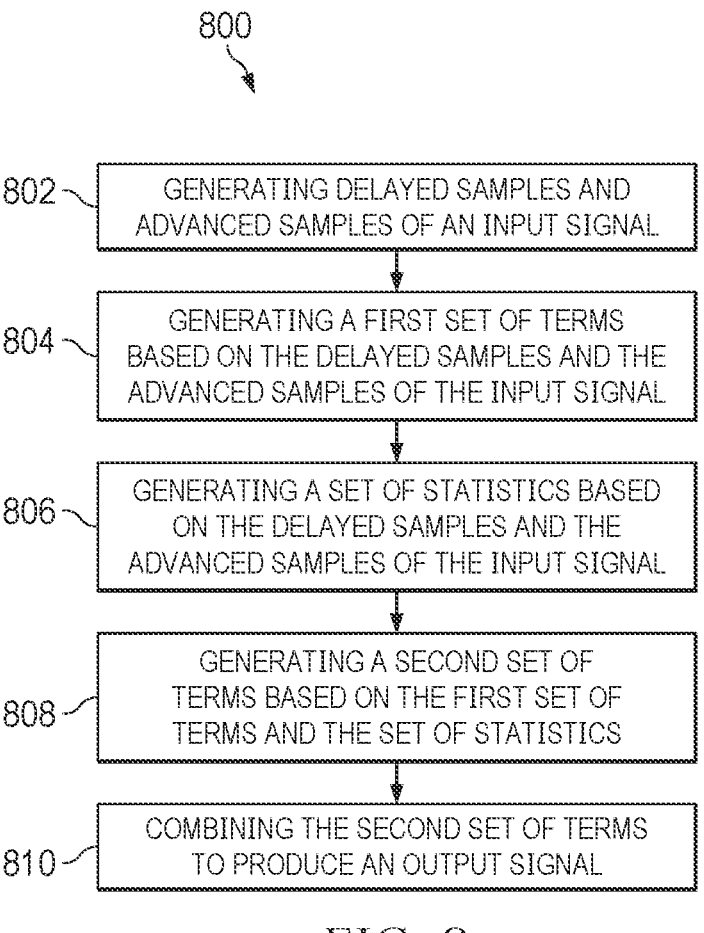

800

802 — GENERATING DELAYED SAMPLES AND ADVANCED SAMPLES OF AN INPUT SIGNAL

804 — GENERATING A FIRST SET OF TERMS BASED ON THE DELAYED SAMPLES AND THE ADVANCED SAMPLES OF THE INPUT SIGNAL

806 — GENERATING A SET OF STATISTICS BASED ON THE DELAYED SAMPLES AND THE ADVANCED SAMPLES OF THE INPUT SIGNAL

808 — GENERATING A SECOND SET OF TERMS BASED ON THE FIRST SET OF TERMS AND THE SET OF STATISTICS

810 — COMBINING THE SECOND SET OF TERMS TO PRODUCE AN OUTPUT SIGNAL

FIG. 8

DIGITAL PRE-DISTORTION CORRECTOR FOR POWER AMPLIFIER

CROSS-REFERENCE TO RELATED APPLICATION

This Application claims the benefit of India Provisional Application 202341015608, filed on Mar. 9, 2023, the contents of which are hereby incorporated by reference in their entirety.

BACKGROUND

A transmit (Tx) signal chain may include a power amplifier to amplify low power radio frequency (RF) signals. For example, a base station may include a Tx chain with a power amplifier to transmit cellular signals.

SUMMARY

A circuit includes a first digital pre-distortion (DPD) corrector, a second DPD corrector, and a signal combiner. The second DPD corrector includes term generator circuitry and a signal statistics circuit. The first DPD corrector has an input and an output. The second DPD corrector has an input coupled to the input of the first DPD corrector and an output. The term generator circuitry has a first input coupled to the input of the second DPD corrector, a second input, and an output coupled to the output of the second DPD corrector. The signal statistics circuit has an input coupled to the input of the second DPD corrector, and an output coupled to the second input of the term generator circuitry. The signal combiner has a first input coupled to the output of the first DPD corrector, a second input coupled to the output of the second DPD corrector, and an output.

An apparatus includes a first DPD corrector, a second DPD corrector, a signal combiner, a digital to analog converter (DAC), and a power amplifier (PA). The first DPD corrector has an input and an output. The second DPD corrector has an input coupled to the input of the first DPD corrector, a second input, and an output. The signal combiner has a first input coupled to the output of the first DPD corrector, a second input coupled to the output of the second DPD corrector, and an output. The DAC has an input coupled to the output of the signal combiner and an output. The PA has an input coupled to the output of the DAC and an output. The second DPD corrector is configured to provide a signal at the output of the second DPD corrector based on a signal at the input of the second DPD corrector and one or more signal statistics derived from the signal at the input of the second DPD corrector.

A method for applying DPD correction to an input signal to produce an output signal includes generating delayed samples and advanced samples of the input signal, generating a first set of terms based on the delayed samples and the advanced samples of the input signal, generating a set of statistics based on the delayed samples and advanced samples of the input signal, generating a second set of terms based on the first set of terms and the set of statistics, and combining the second set of terms to produce the output signal.

BRIEF DESCRIPTION OF THE DRAWINGS

FIG. 8 is a flow diagram illustrating an example method for performing DPD correction.

DETAILED DESCRIPTION

The drawings are not drawn to scale.

A power amplifier (PA) may be used in a transmit (Tx) signal chain to amplify low power radio frequency (RF) signals. For example, a base station includes a Tx signal chain with a PA for transmitting cellular signals. The base station may transmit cellular signals to a user equipment (UE), which may be a smartphone, laptop, tablet, or other type of device with cellular capabilities. The base station and the UE may operate in accordance with a cellular standard, such as $4^{th}$ generation (4G) long-term evolution (LTE), $5^{th}$ generation (5G) new radio (NR), or the like.

A base station can implement techniques such as beamforming and massive multiple-input multiple-output (MIMO) to increase data throughput and reliability when communicating with the UE. In order to implement such techniques, the base station may include a large number of antenna elements, and consequently, a large number of Tx chains. To compensate for increased power draw from the large number of Tx chains, increasing the power efficiency of the Tx chains may be desired. For example, the power efficiency of the PA within the Tx chain may be increased by using Gallium Nitride (GaN) technology. A GaN device may be more power efficient than a comparable silicon device due to the larger bandgap of GaN relative to silicon. However, a GaN PA may experience effects such as electron trapping and de-trapping (e.g., within the GaN material), which can cause distortion at the output of the GaN PA. The present description provides solutions for digital pre-distortion (DPD) correction that may compensate for such effects.

Figure 1:
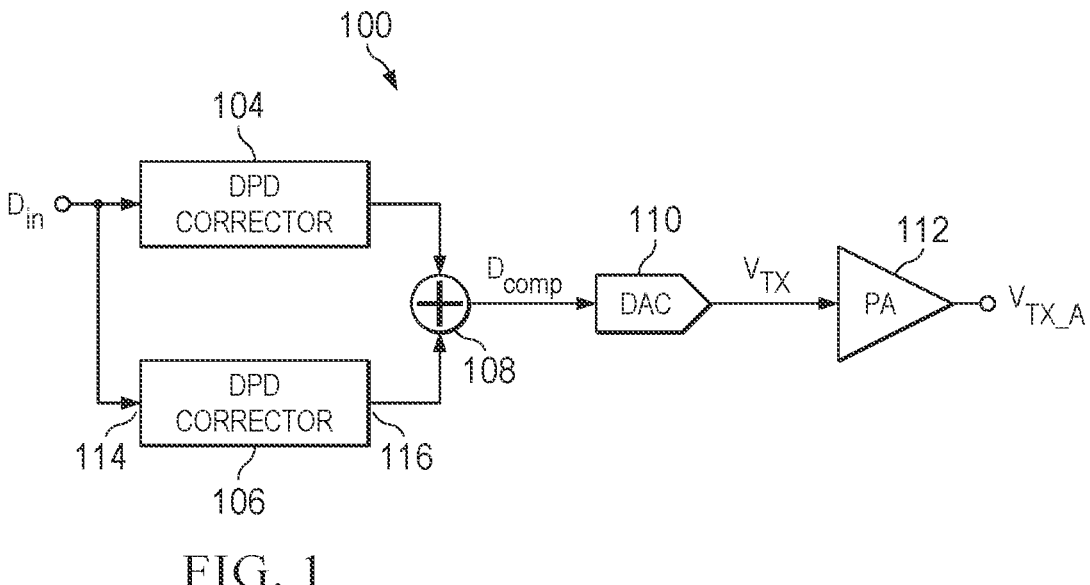
FIG. 1 is a block diagram illustrating an example circuit including a first digital pre-distortion (DPD) corrector in parallel with a second DPD corrector.

FIG. 1 illustrates an example circuit 100 including a (first) DPD corrector 104, a (second) DPD corrector 106, a signal combiner 108, a digital to analog converter (DAC) 110, and a power amplifier (PA) 112. In some examples, the circuit 100 is included in a Tx signal chain or path (e.g., of a base station).

The DPD corrector 104 has an input and an output. The DPD corrector 106 has an input 114 coupled to the input of the DPD corrector 104, and an output 116. The signal combiner 108 has a first input coupled to the output of the DPD corrector 104, a second input coupled to the output 116 of the DPD corrector 106, and an output. The DAC 110 has an input coupled to the output of the signal combiner 108, and an output. The PA 112 has an input coupled to the output of the DAC and an output. The DPD corrector 104 receives a signal $D_{in}$ on the input of the DPD corrector 104, and the DPD corrector 106 receives the signal $D_{in}$ on the input 114.

The signal combiner 108 provides a signal $D_{comp}$ at the output of the signal combiner 108, which is received at the input of the DAC 110. The DAC 110 provides a signal $V_{Tx}$, which is received on the input of the PA 112. The PA 112 provides the signal $V_{Tx\_A}$ at the output of the PA 112.

In some examples, the response of the PA 112 is non-linear. For example, the power of the signal $V_{Tx\_A}$ output by the PA 112 varies non-linearly with respect to the power of the signal $V_{Tx}$ received on the input of the PA 112. The non-linearity of the PA 112 can be pre-compensated in the digital domain using the DPD corrector 104. For example, the DPD corrector 104 applies pre-compensation to the signal $D_{in}$ to produce the signal $D_{comp}$. The compensated signal $D_{comp}$ and the non-linearity of the PA 112 effectively cancel with one another, resulting in the signal $V_{Tx\_A}$ that varies linearly with respect to the signal $D^{in}$. In some examples, the DPD corrector 104 applies the compensation by using a Generalized Memory Polynomial (GMP) model and one or more lookup tables (LUTs). The LUTs are a function of the input signal $D_{in}$, and may be pre-calibrated/pre-programmed with different values depending on a type (e.g., model) of the PA 112. For example, the GMP is modeled by the function $y(n)=x(n)+\Sigma_{k=1}^{N_{LUT}} x(n-l_1(k))$ *LUT($|x(n-l_2(k)|$), where y(n) is the GMP function, x(n) is the nth sample of $D_{in}$, $l_1(k)$ and $l_2(k)$ are functions representing first and second lags (e.g., delayed samples) of x(n), and $N_{LUT}$ is the total number of LUTs. In some examples, the PA 112 is a GaN PA. Although the PA 112 will generally be referred to as a GaN PA in the present description, other suitable types of semiconductors (e.g., silicon) may also be used.

Some aspects of the present description lie in the appreciation that electron trapping and de-trapping may occur within the GaN material of the PA 112, resulting in further non-linearity in the response of the PA 112 that is not compensated for by the DPD corrector 104. For example, variations in the power of the signal $V_{Tx}$ can produce transients in the gain response of the GaN PA due to the electron trapping/de-trapping effects. Further, when the GaN PA transitions from OFF to ON, the GaN PA may experience transient effects (e.g., due to electron trapping/de-trapping), which can degrade metrics such as error vector magnitude (EVM) and adjacent channel leakage ratio (ACLR). Such transient effects are relevant when using time division duplex (TDD) in cellular communications, where the base station alternates between Tx and receive (Rx) over time, causing the PA 112 to alternate between ON and OFF. Transient effects may also occur during frequency division duplex (FDD) operation (e.g., due to variations in the power of the signal $V_{Tx}$).

To compensate for the non-linearity caused by electron trapping/de-trapping within the GaN PA, for example, the circuit 100 further includes the DPD corrector 106 and the signal combiner 108. In some examples, the DPD corrector 106 differs from the DPD corrector 104 in that the DPD corrector 106 generates statistics related to the signal $D_{in}$ over time, and applies compensation to the signal $D_{in}$ based on the statistics. For example, the statistics are derived as a function of the signal $D_{in}$, and the statistics are used to compensate for transients in the response of the GaN PA due to electron trapping/de-trapping effects. In contrast, the DPD corrector 104 applies compensation to the signal $D_{in}$ based on a GMP model and one or more LUTs, as described above. Then, the output of the DPD corrector 106 is combined (e.g., added) with the output of the DPD corrector 104 to produce the compensated signal $D_{comp}$. In some examples, the DPD corrector 106 is used to compensate for GaN PA specific non-linearity (e.g., due to electron trapping/de-trapping), while the DPD corrector 104 is used to compensate for non-linearity exhibited by other PA types in addition to GaN PAs. Further details of the DPD corrector 106 are described with reference to the following figures.

Figure 2:
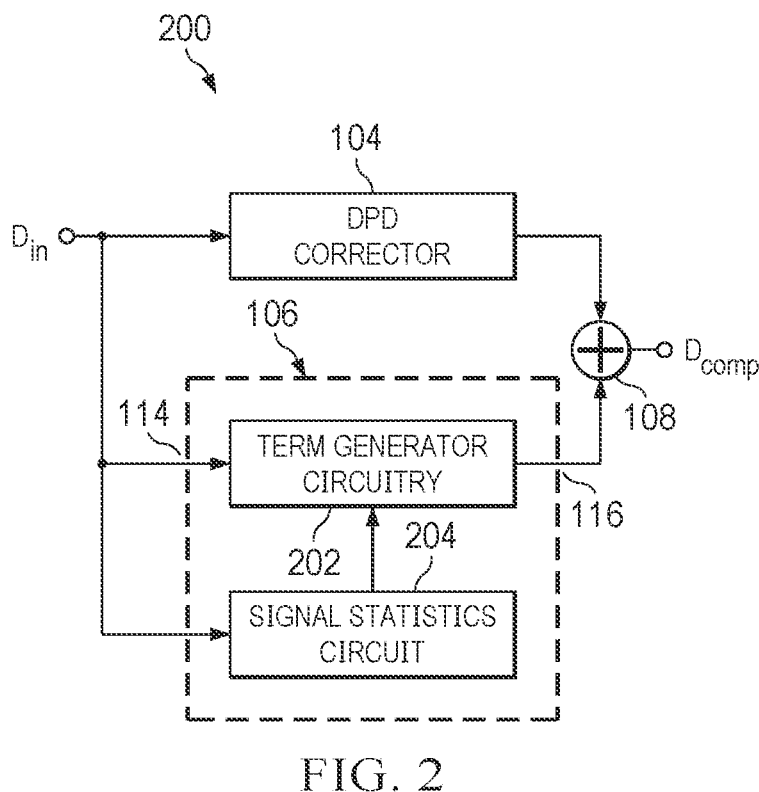
FIG. 2 is a block diagram illustrating an example circuit including details of the second DPD corrector of FIG. 1, including a term generator and a signal statistics circuit.

FIG. 2 illustrates an example circuit 200 including the DPD corrector 104, the DPD corrector 106, and the signal combiner 108 of FIG. 1. As shown, the DPD corrector 106 includes term generator circuitry 202 and a signal statistics circuit 204. The term generator circuitry 202 has a first input coupled to the input 114, a second input (which may represent multiple inputs), and an output coupled to the output 116. The signal statistics circuit 204 has an input coupled to the input 114, and an output (which may represent multiple outputs) coupled to the second input of the term generator circuitry 202. In some examples, the DPD corrector 104, the DPD corrector 106, and the signal combiner 108 are included on a same semiconductor substrate or "chip". Furthermore, the DAC 110 may be included on the same chip as the DPD corrector 104, the DPD corrector 106, and the signal combiner 108, or the DAC 110 may be on a different chip. In a further example, the PA 112 is included on a different chip than the DPD corrector 104, the DPD corrector 106, the signal combiner 108, and/or the DAC 110.

The signal statistics circuit 204 monitors the signal $D_{in}$ at the input of the signal statistics circuit 204 and generates statistics based on the monitoring of the signal $D^{in}$. The signal statistics circuit 204 may provide a set of statistics at the output of the signal statistics circuit 204 based on the generated statistics. In some examples, each of the statistics are based the signal $D_{in}$ and one or more time delayed versions of the signal $D_{in}$.

The term generator circuitry 202 generates a set of terms based on the signal $D_{in}$ at the first input of the term generator circuitry 202 and based on the set of statistics received from the signal statistics circuit 204 at the second input of the term generator circuitry 202. The term generator circuitry 202 combines the set of terms to produce a signal at the output 116.

Figure 3:
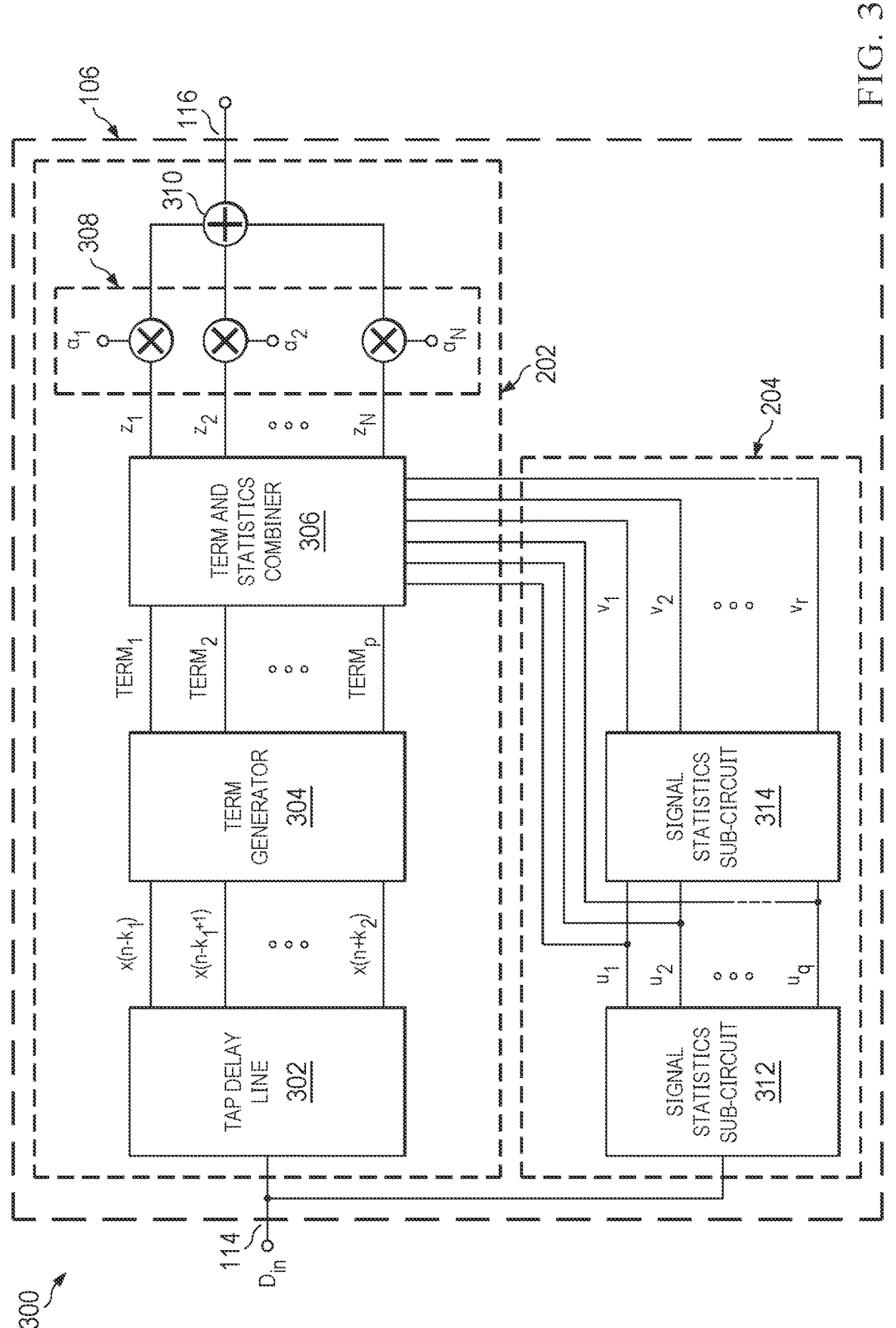
FIG. 3 is a block diagram illustrating an example of further details of the term generator and the signal statistics circuit of FIG. 2.

FIG. 3 illustrates an example circuit 300 including the DPD corrector 106 of FIGS. 1-2. Similar to FIG. 2, the DPD corrector 106 includes the term generator circuitry 202 and the signal statistics circuit 204. As shown, the term generator circuitry 202 includes a tap delay line 302, a term generator 304, a term and statistics combiner 306, a plurality of multipliers 308, and a signal combiner 310. The signal statistics circuit 204 includes a (first) signal statistics sub-circuit 312 and a (second) signal statistics sub-circuit 314.

The tap delay line 302 has an input coupled to the input of the term generator circuitry 202, and a plurality of outputs. The term generator 304 has a plurality of inputs coupled to the plurality of outputs of the tap delay line 302 respectively, and a plurality of outputs. The term and statistics combiner 306 has a first plurality of inputs coupled to the plurality of outputs of the term generator 304 respectively, a second plurality of inputs, and a plurality of outputs. Each signal multiplier of the plurality of signal multipliers 308 has a first input, a second input, and an output. The first inputs of the plurality of signal multipliers 308 are coupled to the plurality of outputs of the term and statistics combiner 306 respectively. The signal combiner 310 has a plurality of inputs, and an output. The plurality of inputs of the signal combiner 310 are coupled to the outputs of the plurality of signal multipliers 308 respectively, and the output of the signal combiner 310 is coupled to the output of the term generator circuitry 202.

The signal statistics sub-circuit 312 has an input coupled to the input of the signal statistics circuit 204, and a plurality of outputs coupled to some of the second plurality of inputs of the terms and statistics combiner 306, which represents the coupling between the output of the signal statistics circuit 204 and the second input of the term generator circuitry 202. The signal statistics sub-circuit 314 has a plurality of inputs coupled to the plurality of outputs of the signal statistics sub-circuit 312, and a plurality of outputs coupled to rest of the second plurality of inputs of the terms and statistics combiner, which represents the coupling between the output of the signal statistics circuit 204 and the second input of the term generator circuitry 202.

As shown, in some examples the output of the signal statistics circuit 204 (e.g., as described with reference to FIG. 2) includes a plurality of outputs at which a plurality of signal statistics $u_1, u_2, \ldots, u_q, v_1, v_2, \ldots, v_r$ are provided. Similarly, the second input of the term generator circuitry 202 includes a plurality of inputs upon which the plurality of signal statistics are received. As shown, the plurality inputs of the term generator circuitry 202 are coupled to the plurality outputs of the signal statistics circuit 204 respectively. The signal statistics $u_1, u_2, \ldots, u_q$ may be referred to as a first set of signal statistics, and the signal statistics $v_1, v_2, \ldots, v_r$ may be referred to as a second set of signal statistics.

The tap delay line 302 generates and provides delayed samples and advanced samples of the signal $D_{in}$ at the plurality of outputs of the tap delay line 302. For example, x(n) represents the nth sample of $D_{in}$, and the tap delay line 302 provides samples in the range of $x(n-k_1)$ to $x(n+k_2)$. The boundary of the delayed samples is determined by $k_1$, and the boundary of the advanced samples is determined by $k_2$. In some examples, the tap delay line 302 delays the input signal $D_{in}$, such that $x(n+k_2)$ represents the "current" sample of $D_{in}$. Accordingly, a time difference between $x(n+k_2)$ and x(n) represents a time delay due to signal processing by the circuit 300. In the illustrated example, a step size of 1 is used between the delayed and advanced samples $x(n-k_1)$, $x(n-k_1+1)$, $\ldots$, $x(n+k_2)$. However, in alternative examples, a different integer value may be used as the step size.

The term generator 304 generates a first plurality of terms (also referred to as a first set of terms) based on signals received on the plurality of inputs of the term generator 304, and provides the first plurality of terms at the plurality of outputs of the term generator 304 respectively. In the illustrated example, the term generator 304 generates the first set of terms based on the delayed samples and/or the advanced samples of the signal $D_{in}$. In some examples, the term generator 304 generates the first set of terms further based on an envelope (e.g., absolute value) of the signal $D_{in}$. As shown, the first set of terms may include p number of terms $Term_1, Term_2, \ldots, Term_p$, which may include linear and/or non-linear terms. In some examples, the linear terms are generated as x(n−l), where $-k_2 \leq l \leq k_1$ and $k_1=k_2=1$. Further, the non-linear terms are generated by $x(n-l_1)|x(n-l_2)|^m$, where $-k_2 \leq l_1 \leq k_1$, $-k_2 \leq l_2 \leq k_1$, and $k_1=k_2=1$. Although example of $k_1=k_2=1$ is used, other alternatives such as $k_1=k_2=2$, $k_1=k_2=3$, etc. may also be used depending on a type of the PA 112. Further, a value of m may be selected based on the type of the PA 112. Each term of the p number of terms is generated as a linear term or a non-linear term which, for example, is pre-calibrated for each PA type. In some examples, the values of m ranges between 1 and 21. In some additional or alternative examples, m is selected from a set of even integers containing 2, 4, 6, 8, and 10.

The term and statistics combiner 306 generates a second plurality of terms (also referred to as a second set of terms) based on the first set of terms and the first and second sets of signal statistics. The generation of the second set of terms may be further based on a type (e.g., model) of the PA (e.g., PA 112). For example, the term and statistics combiner 306 generates the second set of terms based on a statistics model, and a different statistics model is used for different PAs. As shown, the second set of terms includes N number of terms $z_1, z_2, \ldots, z_N$. In some examples, the second set of terms are generated as $z_h=Term_i*u_j$ where $h=1, 2, \ldots, N$, $1 \leq i \leq p$, and $1 \leq j \leq q$. In some examples, the second set of terms are generated as $z_h=Term_1*v_k$ where $h=1, 2, \ldots, N$, $1 \leq i \leq p$, and $1 \leq k \leq r$. In some alternative examples, some terms are generated according to the first equation, while other terms are generated according to the second equation. The specific Term and statistics u, v used to generate a given term z may vary, for example, depending on a type of the PA. Note, a single term from the first set of terms (e.g., $Term_1$) may be used to generate multiple terms from the second set of terms. For example, $z_1=Term_1*u_1$ and $z_2=Term_1*v_1$. As shown, the term and statistics combiner 306 provides the second set of terms at the plurality of outputs of the term and statistics combiner 306.

Each signal multiplier of the plurality of signal multipliers 308 provides a signal at the output of the signal multiplier based on a multiplication of a signal received on the first input of the signal multiplier and a signal received on the second input of the signal multiplier. As shown, the terms (e.g., signals) $z_1, z_2, \ldots, z_N$ are received on the first inputs of the plurality of signal multipliers 308 respectively, and the terms $\alpha_1, \alpha_2, \ldots, \alpha_N$, are received on the second inputs of the plurality of signal multipliers 308 respectively. Accordingly, the plurality of signal multipliers 308 output signals $z_1*\alpha_1, z_2*\alpha_2, \ldots, z_N*\alpha_N$ respectively, which are received by the signal combiner 310. The signal combiner 310 combines the received signals, and provide a combined signal at the output of the signal combiner 310. For example, the signal combiner 310 adds the received signals to produce the signal at the output of the signal combiner 310. In some examples, the terms $\alpha_1, \alpha_2, \ldots, \alpha_N$ are pseudo static coefficients received from a DPD estimator, as described below with reference to FIG. 8. In one example, the DPD corrector 106 is implemented by hardware such as logic circuitry, and the DPD estimator is implemented in hardware such as logic circuitry and/or software executed in a processor.

The signal statistics cub-circuit 312 generates the first set of signal statistics based the signal $D_{in}$ received on the input of the signal statistics sub-circuit 312. For example, the signal statistics sub-circuit 312 generates the first set of signal statistics based on the signal $D_{in}$ and one or more delayed samples of $D_{in}$. In some further examples, the signal statistics sub-circuit 312 generates the first set of signal statistics based on absolute values of the signal $D_{in}$ and the one or more delayed samples of $D_{in}$. Additionally or alternatively, one or more sets of independent parameters may be configured, where a different set of independent parameters is used to generate each signal statistic $u_1, u_2, \ldots, u_q$ of the first set of signal statistics.

The signal statistics sub-circuit 314 generates the second set of signal statistics based on the first set of signal statistics. For example, the signal statistics sub-circuit 314 generates each signal statistic $v_1, v_2, \ldots, v_r$ of the second set of signal statistics based on a multiplication of one or more statistics of the first set of signal statistics. In one example, the signal statistics sub-circuit 314 generates the signal statistics as $v_1=u_1{}^2$, $v_2=u_1*u_2$, etc. The one or more statistics to be multiplied may be selected from the first set of signal statistics based on a type of the PA (e.g., PA 112).

Figure 4:
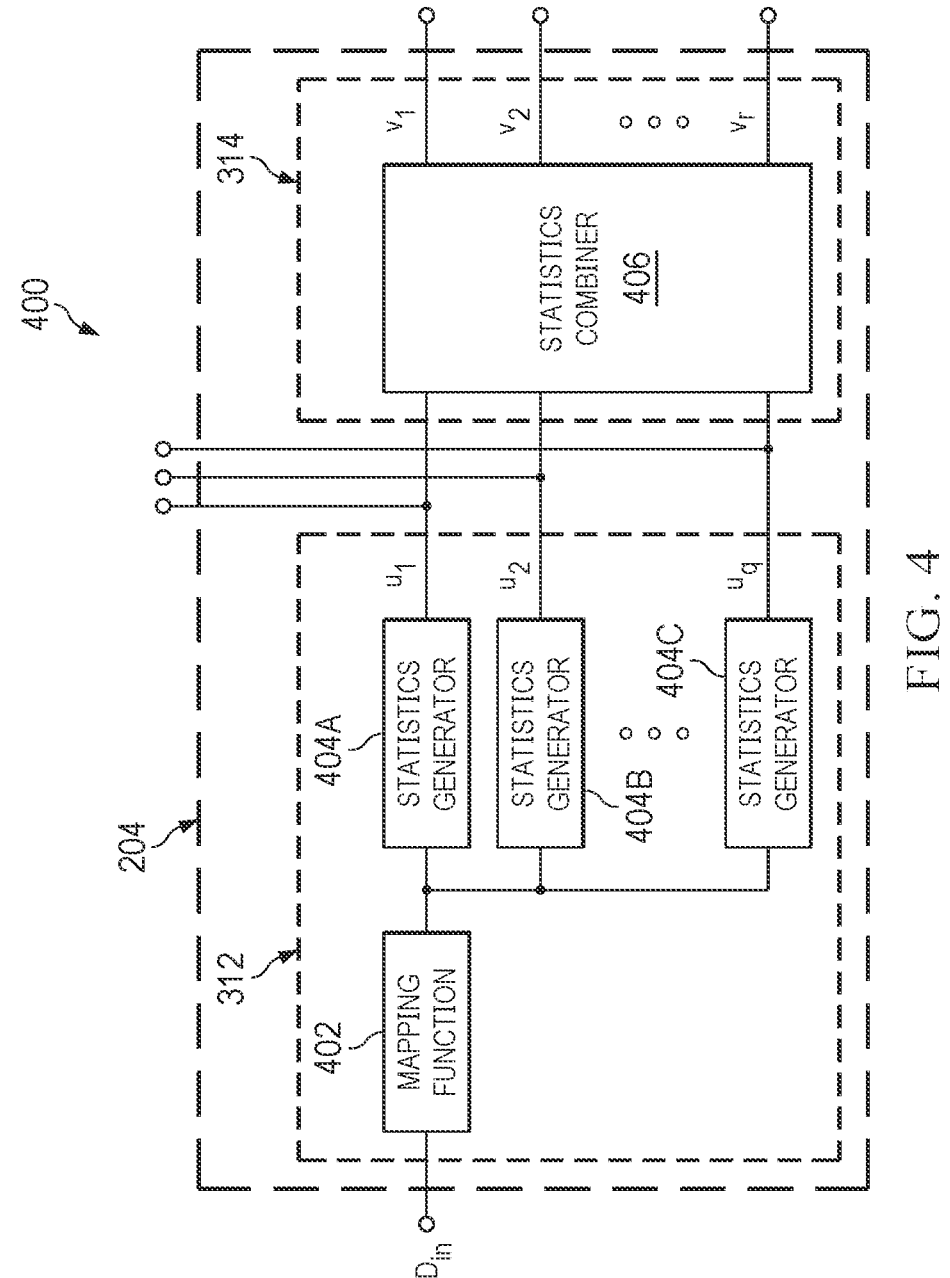
FIG. 4 is a block diagram illustrating an example of further details of the signal statistics circuit of FIGS. 2-3.

FIG. 4 illustrates an example circuit 400 including the signal statistics circuit 204 of FIG. 3. Similar to FIG. 3, the signal statistics circuit 204 includes the (first) signal statistics sub-circuit 312 and the (second) signal statistics sub-circuit 314. As shown, the signal statistics sub-circuit 312 includes a mapping function 402, and a plurality of statistics generators 404A, 404B, 404C. The signal statistics sub-circuit 314 includes a statistics combiner 406.

The mapping function 402 (also referred to as a signal mapper) has an input coupled to the input of the signal statistics sub-circuit 312, and an output. As shown, each of the statistics generators 404A, 404B, 404C has an input coupled to the output of the mapping function 402, and an output coupled to an output of the plurality of outputs of the signal statistics sub-circuit 312 respectively. The statistics combiner 406 has a plurality of inputs coupled to the plurality of inputs of the signal statistics sub-circuit 314, and a plurality of outputs coupled to the plurality of outputs of the signal statistics sub-circuit 314.

In some examples, the mapping function 402 provides the absolute value of the signal $D_{in}$ at the output of the mapping function 402. The provided signal is received at the inputs of the statistics generators 404A, 404B, 404C.

As shown, the signal statistics sub-circuit 312 includes q number of statistics generators 404A, 404B, . . . , 404C. Each statistics generator provides one of the signal statistics $u_1$, $u_2$, . . . , $u_q$ respectively. In some examples, the signal statistics are generated according to the equation $u_i(n)=f_i(\{|x(n)|, |x(n-1)|, \ldots, |x(0)|\})$, where $i=1, 2, \ldots, q$, and $x(n)$ is the nth sample of $D_{in}$ (e.g., at the time instance n). In the example of FIG. 4, the function $f_i$ corresponds to the ith statistics generator. For example, the function $f_1$ corresponds to the statistics generator 404A, the function $f_2$ corresponds to the statistics generator 404B, the function $f_q$ corresponds to the statistics generator 404C, etc.

In some examples, each statistics generator generates an average of the input of the statistics generator, and provides the generated average at the output of the statistics generator. For example, the statistics generator includes a state dependent dual time constant filter. An example state dependent dual time constant filter can be modeled by the following equations:

$$(1 + 2f_{DPD}\tau_d)\text{out}(n) + (1 - 2f_{DPD}\tau_d)\text{out}(n - 1) = 2|\text{in}(n)|, \quad \text{out}(n - 1) > |\text{in}(n)|$$

$$(1 + 2f_{DPD}\tau_u)\text{out}(n) + (1 - 2f_{DPD}\tau_u)\text{out}(n - 1) = 2|\text{in}(n)|, \quad \text{out}(n - 1) \le |\text{in}(n)|$$

Where in(n) is the input of the filter, out(n) is the output of the filter, and $f_{DPD}$ is the dynamic DPD sampling frequency. Filter parameters $\tau_d$ and $\tau_u$ denote the discharging and charging time constants respectively, which may be independent (e.g., different values) for each statistics generator. In some examples, the filter parameters $\tau_d$ and $\tau_u$ vary depending on a type of the PA (e.g., PA 112). In an alternative example, the statistics generator includes a moving average filter with length $L_k$, $k=1, 2, \ldots, q$.

The statistics combiner 406 generates the second set of signal statistics based on the first set of signal statistics. For example, the statistics combiner 406 generates the second example, the statistics combiner 406 generates the second set of signal statistics $v_1, v_2, \ldots, v_r$ according to the equation:

$$v_i = u_1{}^{n_{i1}} * u_2{}^{n_{i2}} * \ldots * u_q{}^{n_{iq}}.$$

Where $n_{i1}, n_{i2}, \ldots, n_{iq}$ are non-negative integers. The values of the non-negative integers, for example, vary based on a type of the PA (e.g., PA 112). Furthermore, the number of signal statistics generated by the statistics combiner 406 may be dependent on the type of the PA. In some examples, the values of p, q, r, N are determined based on the type of the PA.

Figure 5:
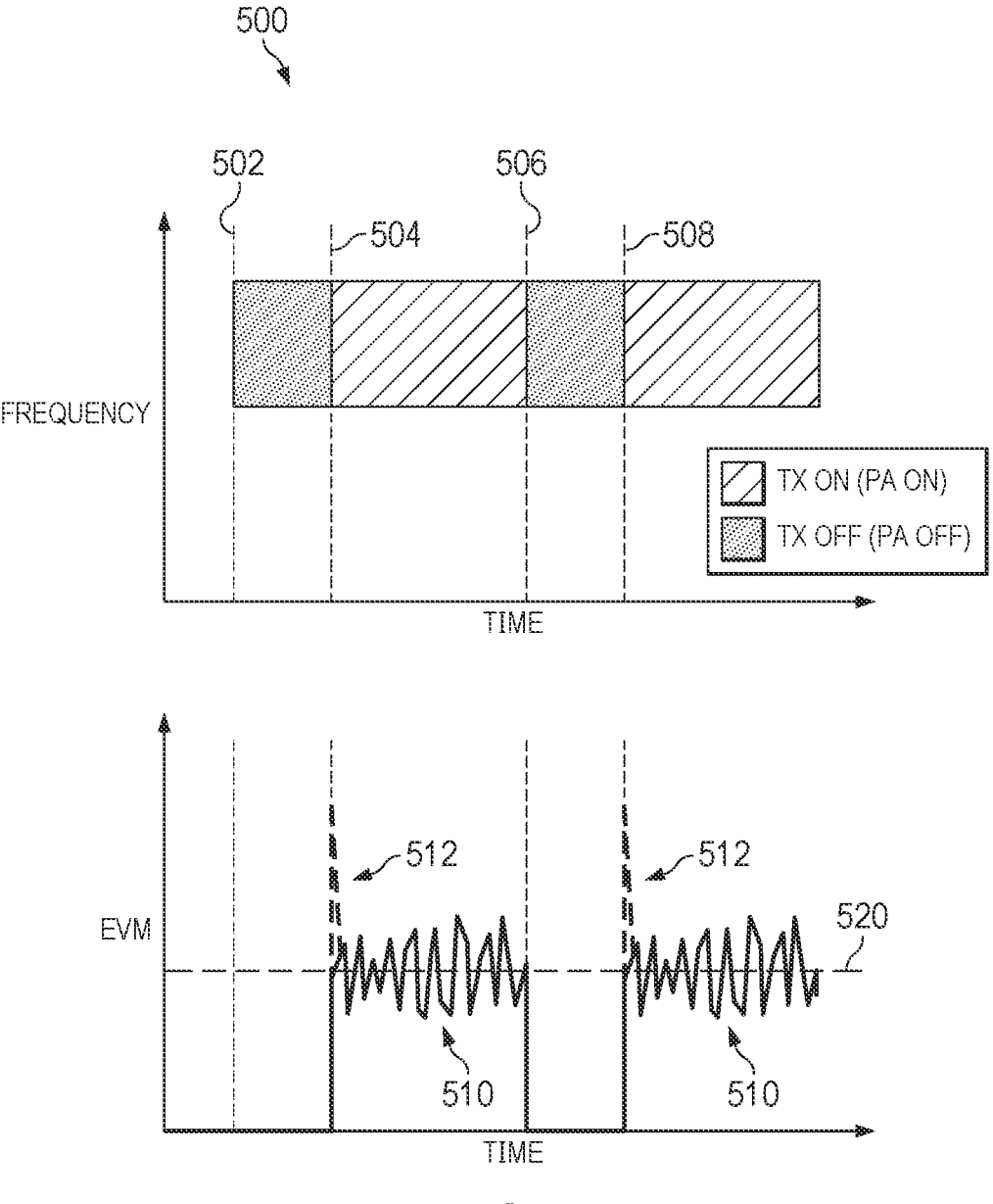
FIG. 5 is a waveform diagram illustrating an example error vector magnitude (EVM) in an example time division duplex (TDD) system over time.

FIG. 5 illustrates an example waveform 500 of an EVM 510 in a TDD system over time. The waveform 500 may correspond to a Tx chain including a first DPD corrector and a second DPD corrector, as described with reference to FIG. 1 and throughout the present description.

As shown, the system alternates between Tx ON and Tx OFF, during which the PA is ON and OFF respectively. At a first point in time 502, the system is in the Tx OFF state. At a second point in time 504, the system transitions to the Tx ON state, causing the PA to turn ON. In the Tx ON state, the EVM 510 fluctuates around an average EVM value 520. At a third point in time 506, the system transitions to the Tx OFF state, causing the PA to turn OFF. At a fourth point in time 508, the system transitions to the Tx ON state, causing the PA to turn ON. Again, the EVM 510 fluctuates around the average EVM value 520.

Further illustrated is a hypothetical EVM 512. The hypothetical EVM 512 represents the EVM in the absence of the previously described DPD correction (e.g., by DPD corrector 106). As shown, the hypothetical EVM 512 experiences a transient when the system transitions from the Tx OFF to the Tx ON state (e.g., when the PA transitions from OFF to ON). For example, the transient occurs due to electron trapping/de-trapping effects, as previously described. As a result, the EVM 512 is degraded for a time period immediately following the Tx OFF to Tx ON transition at the second point in time 504 and the fourth point in time 508. When considering a cellular communications system, the EVM 512 could be degraded for multiple symbols in the time domain following the transition from Rx (e.g., Tx OFF) to Tx in TDD. In contrast, the EVM 510 represents the EVM when DPD correction (e.g., by DPD correctors 104, 106) is applied. As shown, the DPD correction compensates for the transient effects, resulting in improved EVM during the time period immediately following the Tx OFF to Tx ON transitions.

Figure 6:
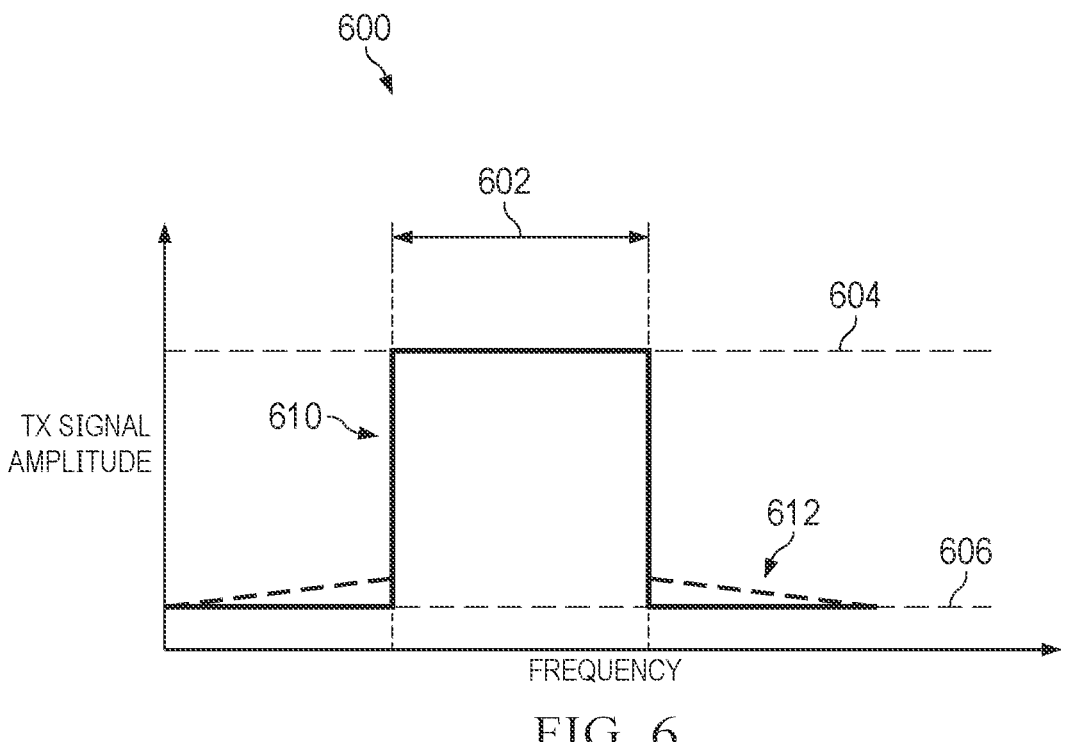
FIG. 6 is a waveform diagram illustrating an example transmit (Tx) signal amplitude with respect to frequency.

FIG. 6 illustrates an example waveform 600 of a Tx signal amplitude 610 with respect to frequency. The waveform 600 may correspond to a Tx chain including a first DPD corrector and a second DPD corrector, as described with reference to FIG. 1 and throughout the present description.

As shown, the Tx signal amplitude 610 is a first value 604 within a bandwidth 602 of the frequency domain. Further, the Tx signal amplitude 610 is a second value 606 outside of a bandwidth 602 (also referred to as a frequency band). The first value 604 is greater than the second value 606, such that the Tx signal amplitude 610 is the largest within the bandwidth 602.

Further illustrated is a hypothetical Tx signal amplitude 612. The hypothetical Tx signal amplitude 612 represents the Tx signal amplitude in the absence of the previously described DPD correction (e.g., by the DPD corrector 106). As shown, the hypothetical Tx signal amplitude 612 is greater than the Tx signal amplitude 610 outside of the bandwidth 602, which is also referred to as signal "leakage". For example, the signal leakage occurs due to electron trapping/de-trapping effects, as previously described. As a result, the ACLR is degraded for the hypothetical Tx signal, which can cause interference on adjacent frequency bands when transmitting the hypothetical Tx signal. In contrast, the Tx signal amplitude 610 represents the Tx signal amplitude when DPD correction (e.g., by DPD correctors 104, 106) is applied. As shown, the DPD correction compensates for signal leakage due to electron trapping/de-trapping, resulting in improved ACLR.

Figure 7:
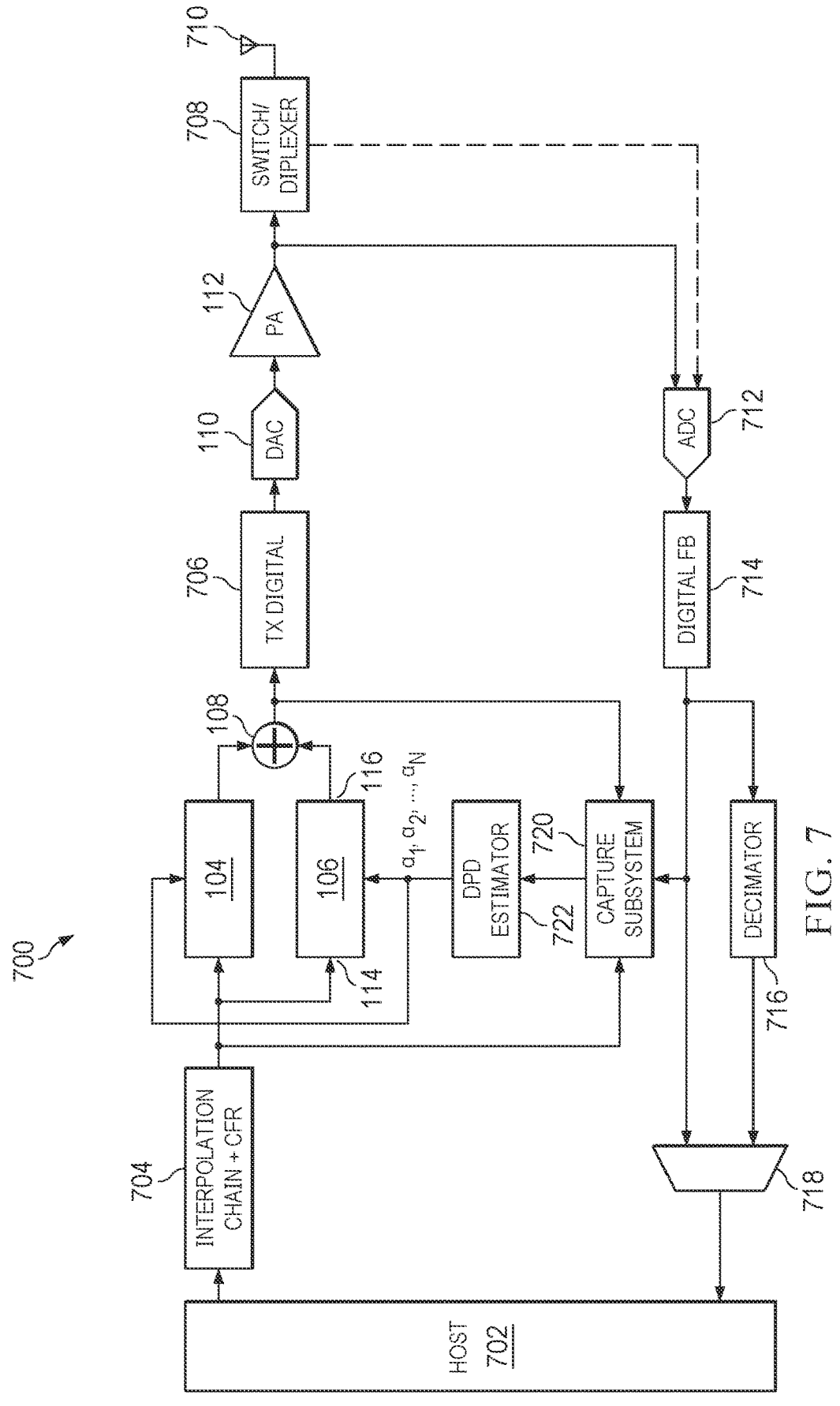
FIG. 7 is a block diagram illustrating an example of a Tx signal chain including first and second DPD correctors arranged in parallel.

FIG. 7 illustrates an example circuit 700 of a Tx signal chain including the (first) DPD corrector 104 and the (second) DPD corrector 106. In some examples, the circuit 700 is included in a base station. The circuit 700 further includes the (first) signal combiner 108, the DAC 110, the PA 112, a HOST 702, an interpolation chain 704, Tx digital circuitry 706, a switch/diplexer 708, an antenna 710, an analog to digital converter (ADC) 712, a digital feedback circuit 714, a decimator 716, a multiplexer 718, a capture subsystem 720, and a DPD estimator 722.

The HOST 702 has an output and an input. The interpolation chain 704 has an input coupled to the output of the HOST 702, and an output. In an example, the HOST 702 is a processor, such as a digital signal processor (DSP) operating as a central processing unit (CPU). The DPD corrector 104 has a first input coupled to the output of the interpolation chain 704, a second input, and an output. The DPD corrector 106 has a first input 114 coupled to the output of the interpolation chain 704, a second input, and an output 116. The signal combiner has a first input coupled to the output of the DPD corrector 104, a second input coupled to the output 116, and an output.

The Tx digital circuitry 706 has an input coupled to the output of the signal combiner 108, and an output. The DAC 110 has an input coupled to the output of the Tx digital circuitry 706, and an output. The PA 112 has an input coupled to the output of the DAC 110, and an output. The switch/diplexer 708 has an input coupled to the output of the PA 112, and an output. The antenna 710 is coupled to the output of the switch/diplexer 708.

The ADC 712 has an input coupled to the output the PA 112, and an output. The digital feedback circuit 714 has an input coupled to the output of the ADC 712, and an output. The decimator 716 has an input coupled to the output of the digital feedback circuit 714, and an output. The multiplexer 718 has a first input coupled to the output of the digital feedback circuit 714, a second input coupled to the output of the decimator 716, and an output coupled to the input of the HOST 702.

The capture subsystem 720 has a first input coupled to the output of the interpolation chain 704, a second input coupled to the output of the signal combiner 108, a third input coupled to the output of the digital feedback circuit 714, and an output. The DPD estimator 722 has an input coupled to the output of the capture subsystem, and an output coupled to the second input of the DPD corrector 704 and coupled to the second input of the DPD corrector 106.

The HOST 702 provides a Tx signal at the output of the HOST 702. The interpolation chain 704 performs interpolation (e.g., upsampling) on the Tx signal. Optionally, the interpolation chain 704 may also perform Crest Factor Reduction (CFR) on the Tx signal. In the example of FIG. 7, the HOST 702 and the interpolation chain 704 are illustrated as separate elements. However, in alternative examples the interpolation chain 704 is included within the HOST 702, such that the HOST 702 further performs the operations of the described interpolation chain 704.

The DPD correctors 104, 106 may perform DPD correction as described with reference to FIG. 1 and throughout the present description. The signals output by the DPD correctors 104, 106 are combined by the signal combiner 108, and the combined signal is provided at the output of the signal combiner 108.

The Tx digital circuitry 706 performs digital signal processing on the signal received on the input of the Tx digital circuitry 706, for example, IQ modulation, etc. The Tx digital circuitry 706 provides the processed digital signal at the output of the Tx digital circuitry 706 to the DAC 110, which converts the signal to an analog signal. The DAC 110 provides the analog signal at the output of the DAC 110 to the PA 112, which amplifies the signal. In some examples, the switch/diplexer 708 includes a switch, which switches between Tx and Rx during TDD operation. In alternative examples, the switch/diplexer 708 includes a diplexer, which is used to isolate Tx and Rx signals during FDD operation. In both examples, the switch/diplexer 708 provides the signal to the antenna 710 for transmission (e.g., over an air interface).

In some examples, the switch/diplexer 708 additionally has an output coupled to an input of the ADC 712 (illustrated by the dashed line). In such examples, the ADC 712, the digital feedback circuit 714, the decimator 716, and/or the multiplexer 718 may act as an Rx chain to process signals received via the antenna 710, for example, during Rx operation in TDD. Further, during Tx operation in TDD, the ADC 712, the digital feedback circuit 714, the decimator 716, and/or the multiplexer 718 may be used to process feedback from the PA 112.

In alternative examples, the ADC 712, the digital feedback circuit 714, the decimator 716, and/or the multiplexer 718 are used to process feedback from the PA 112 only, and separate circuitry (not shown) is used for processing Rx signals received via the antenna 710. For example, since Tx and Rx may occur simultaneously in FDD, separate circuitry is used for processing feedback from the PA 112 and Rx signals received via the antenna 710.

The ADC 712 converts the analog signal received on the input of the ADC 712 to a digital signal, which is provided at the output of the ADC 712. The digital feedback circuit 714 performs digital signal processing on the signal output by the ADC 712 which includes, for example, down-converting the signal by the carrier frequency. The decimator 716 downsamples a signal received on the input of the decimator, and provide the downsampled signal at the output of the decimator. The multiplexer 718 selects a signal from the first and second inputs of the multiplexer 718 to be provided at the output of the multiplexer 718 to the HOST 702. Although not shown, the multiplexer 718 may include a control input to control selection between the first and second inputs. In some examples, the control input of the multiplexer 718 is coupled to the HOST 702. By controlling the multiplexer 718, the HOST 702 can select between a higher sample rate (e.g., from the digital feedback circuit 714) or a lower sample rate (e.g., from the decimator 716) of the feedback signal from the PA 112, depending on the needs of the HOST 702.

The capture subsystem 720 captures a block of samples in a time aligned fashion at the DPD input (e.g., of 104, 106), the DPD output (e.g., of 104, 106), and the feedback output (e.g., of 714). The samples are provided to the DPD estimator 722, which utilizes the samples to estimate coefficients (e.g., $\alpha_1$, $\alpha_2$, . . . , $\alpha_N$) to be used for DPD correction.

The DPD estimator 722 generates one or more terms (e.g., coefficients) based on the output of the capture subsystem 720. The one or more terms, for example, correspond to $\alpha_1$, $\alpha_2$, . . . , $\alpha_N$ of FIG. 3. The one or more terms are provided to the second input of the DPD corrector 104 and the second input of the DPD corrector 106. In some examples, the DPD estimator 722 is generates the one or more terms further based on one or more system parameters. For example, the one or more system parameters includes a temperature of the system, and the DPD estimator 722 generates the one or more terms based on the temperature of the system.

In some examples, the DPD corrector 104, DPD corrector 106, signal combiner 108, Tx digital circuitry 706, and DAC 110 are included on a same chip. In a further example, the HOST 702 and the PA 112 are on different chips than the chip including the DPD corrector 104, DPD corrector 106, signal combiner 108, Tx digital circuitry 706, and DAC 110. The interpolation chain 704 may be included on the same chip or a different chip than the chip including the DPD corrector 104, DPD corrector 106, signal combiner 108, Tx digital circuitry 706, and DAC 110.

Also, the DAC 110, PA 112, switch/diplexer 708, antenna 710, and ADC 712 are implemented in analog circuitry. In an example, the DPD corrector 104, the DPD corrector 106, the signal combiner 108, the interpolation chain 704, the Tx digital circuitry 706, the digital feedback circuit 714, the decimator 716, the multiplexer 718, the capture subsystem 720, and the DPD estimator 722 are constructed using digital logic circuitry including combinations of logic gates. In another example, one or more of the DPD corrector 104, the DPD corrector 106, the signal combiner 108, the interpolation chain 704, the Tx digital circuitry 706, the digital feedback circuit 714, the decimator 716, the multiplexer 718, the capture subsystem 720, or the DPD estimator 722 are included in or implemented by a DSP. In another example, one or more of the DPD corrector 104, the DPD corrector 106, the signal combiner 108, the interpolation chain 704, the Tx digital circuitry 706, the digital feedback circuit 714, the decimator 716, the multiplexer 718, the capture subsystem 720, or the DPD estimator 722 are implemented by a processor executing software.

FIG. 8 is a flow diagram 800 illustrating an example method for performing DPD correction. In some examples, the operations represented by the blocks of flow diagram 800 are performed by all or part of the circuits shown in FIGS. 1, 2, 3, 4, and 7.

Block 802 includes generating delayed samples and advanced samples of an input signal. For example, the delayed and advanced samples of an input signal (e.g., $D_{in}$) are generated by a tap delay line (e.g., tap delay line 302).

Block 804 includes generating a first set of terms based on the delayed and advanced samples of the input signal. For example, generating the first set of terms includes generating one or more linear and/or non-linear terms using a term generator (e.g., term generator 304), as described with reference to FIG. 3.

Block 806 includes generating a set of statistics based on the delayed and advanced samples of the input signal. For example, generating the set of statistics includes generating the first set of signal statistics and/or the second set of signal statistics using signal statistics sub-circuits (e.g., 312 and 314), as described with reference to FIGS. 3-4.

Block 808 includes generating a second set of terms based on the first set of terms and the set of statistics. For example, the second set of terms is generated based on a multiplication of the first set of terms and the statistics using a term and statistics combiner (e.g., 306), as described with reference to FIG. 3.

Block 810 includes combining the second set of terms to produce a first output signal. For example, the second set of terms are combined by a signal combiner (e.g., signal combiner 310). In some examples, each term of the second set of terms is multiplied by a respective coefficient (e.g., $\alpha_1$, $\alpha_2$, . . . , $\alpha_N$) before being combined to produce the first output signal.

In some examples, block 810 further includes combining the first output signal and a second output signal to produce a third output signal (e.g., using signal combiner 108). For example, the second output signal is generated using a GMP model and one or more LUTs based on the input signal (e.g., using DPD corrector 104).

The methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further, one or more of the operations or events depicted herein may be performed in one or more separate operations and/or phases. In some examples, the methods described above may be implemented in a computer readable medium using instructions stored in a memory.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means+/–10 percent of that parameter. Modifications are possible in the described examples, and other implementations are possible, within the scope of the claims.

What is claimed is:

1. A circuit comprising:

a first digital pre-distortion (DPD) corrector having an input and an output;

a second DPD corrector having an input coupled to the input of the first DPD corrector, and an output, the second DPD corrector including:

term generator circuitry having a first input coupled to the input of the second DPD corrector, a second input, and an output coupled to the output of the second DPD corrector;

a signal statistics circuit having an input coupled to the input of the second DPD corrector, and an output coupled to the second input of the term generator circuitry; and a signal combiner having a first input coupled to the output of the first DPD corrector, a second input coupled to the output of the second DPD corrector, and an output;

wherein the term generator circuitry includes a tap delay line having an input coupled to the first input of the term generator circuitry, and a plurality of outputs; and wherein the tap delay line is configured to provide a plurality of delayed or advanced signal samples at the plurality of outputs respectively based on a first input signal received on the input of the tap delay line;

wherein the term generator circuitry further includes a term generator having a plurality of inputs coupled to the plurality of outputs of the tap delay line respectively, and a plurality of outputs; and wherein the term generator is configured to provide a plurality of terms at the plurality of outputs of the term generator based on signals received on the plurality of inputs of the term generator; and wherein the term generator circuitry further includes a term and statistics combiner having a first plurality of inputs coupled to the plurality of outputs of the term generator respectively, a second plurality of inputs coupled to the output of the signal statistics circuit, and a plurality of outputs.

2. A circuit comprising:

a first digital pre-distortion (DPD) corrector having an input and an output;

a second DPD corrector having an input coupled to the input of the first DPD corrector, and an output, the second DPD corrector including:

term generator circuitry having a first input coupled to the input of the second DPD corrector, a second input, and an output coupled to the output of the second DPD corrector;

a signal statistics circuit having an input coupled to the input of the second DPD corrector, and an output coupled to the second input of the term generator circuitry; and a signal combiner having a first input coupled to the output of the first DPD corrector, a second input coupled to the output of the second DPD corrector, and an output, wherein the signal statistics circuit includes:

a plurality of statistics generators each having an input and an output, wherein the outputs of the plurality of statistics generators are coupled to the output of the signal statistics circuit; and a signal mapper having an input coupled to the input of the signal statistics circuit, and an output coupled to the inputs of the plurality of statistics generators.

3. The circuit of claim 2, wherein the term generator circuitry includes a tap delay line having an input coupled to the first input of the term generator circuitry, and a plurality of outputs; and wherein the tap delay line is configured to provide a plurality of delayed or advanced signal samples at the plurality of outputs respectively based on a first input signal received on the input of the tap delay line.

4. The circuit of claim 3, wherein the term generator circuitry further includes a term generator having a plurality of inputs coupled to the plurality of outputs of the tap delay line respectively, and a plurality of outputs; and wherein the term generator is configured to provide a plurality of terms at the plurality of outputs of the term generator based on signals received on the plurality of inputs of the term generator.

5. The circuit of claim 4, wherein the term generator is further configured to provide a linear term as one of the plurality of terms, the linear term equal to a time delayed version of the first input signal.

6. The circuit of claim 5, wherein the term generator is further configured to provide a non-linear term as one of the plurality of terms, wherein the non-linear term is a function of a first time delayed version of the first input signal and a signal envelope based on a second time delayed version of the first input signal.

7. The circuit of claim 4, wherein the term generator circuitry further includes a term and statistics combiner having a first plurality of inputs coupled to the plurality of outputs of the term generator respectively, a second plurality of inputs coupled to the output of the signal statistics circuit, and a plurality of outputs.

8. The circuit of claim 7, further comprising:

a plurality of signal multipliers each having a first input, a second input, and an output; and a signal combiner having a plurality of inputs, and an output coupled to the output of the term generator circuitry;

wherein the first inputs of the plurality of signal multipliers are coupled to the plurality of outputs of the term and statistics combiner respectively, and wherein the outputs of the plurality of signal multipliers are coupled to the plurality of inputs of the signal combiner respectively.

9. The circuit of claim 2, wherein a first statistics generator of the plurality of statistics generators is configured to provide a signal at the output of the first statistics generator based on a signal at the input of the first statistics generator and one of: a state dependent dual time constant filter or a moving average filter.

10. The circuit of claim 2, wherein the signal statistics circuit further includes:

a statistics combiner having a plurality of inputs coupled to the outputs of the plurality of statistics generators respectively, and a plurality of outputs coupled to the output of the signal statistics circuit.

11. The circuit of claim 10, wherein the statistics combiner is configured to output a signal based on a multiplication of signals received on the plurality of inputs of the statistics combiner.

12. An apparatus comprising:

a first digital pre-distortion (DPD) corrector having an input and an output;

a second DPD corrector having an input coupled to the input of the first DPD corrector, a second input, and an output;

a signal combiner having a first input coupled to the output of the first DPD corrector, a second input coupled to the output of the second DPD corrector, and an output;

a digital to analog converter (DAC) having an input coupled to the output of the signal combiner, and an output; and a power amplifier (PA) having an input coupled to the output of the DAC, and an output;

wherein the second DPD corrector is configured to provide a signal at the output of the second DPD corrector based on a signal at the input of the second DPD corrector and one or more signal statistics derived from the signal at the input of the second DPD corrector; and wherein the second DPD corrector comprises a signal statistics circuit that includes:

a plurality of statistics generators each having an input and an output, wherein the outputs of the plurality of statistics generators are coupled to the output of the signal statistics circuit; and a signal mapper having an input coupled to the input of the signal statistics circuit, and an output coupled to the inputs of the plurality of statistics generators.

13. The apparatus of claim 12, further comprising:

a feedback circuit having an input coupled to the output of the PA, and an output; and a DPD estimator having an input coupled to the output of the feedback circuit, and an output coupled to the second input of the second DPD corrector.

14. The apparatus of claim 13, wherein the second DPD corrector is further configured to provide the signal at the output of the second DPD corrector based on a multiplication by a signal received on the second input of the second DPD corrector.

15. The apparatus of claim 12, wherein the second DPD corrector is further configured to provide the signal at the output of the second DPD corrector based on delayed samples and advanced samples of the signal at the input of the second DPD corrector.

16. A method for applying digital pre-distortion (DPD) correction to an input signal to produce an output signal, the method comprising:

generating delayed samples and advanced samples of the input signal using a tap delay line;

generating a first set of terms based on the delayed samples and the advanced samples of the input signal using a term generator having a plurality of inputs respectively coupled to a plurality of outputs of the tap delay line;

generating a first set of statistics based on the delayed samples and advanced samples of the input signal using a first signal statistics circuit;

generating a second set of terms based on the first set of terms and the first set of statistics using a second signal statistics circuit; and combining the second set of terms to produce the output signal using a term and statistics combiner having a first plurality of inputs respectively coupled to a plurality of outputs of the term generator, a second input coupled to an output of the first signal statistics circuit, and a third input coupled to an output of the second signal statistics circuit.

17. The method of claim 16, wherein the first set of terms includes a linear term equal to a delayed or advanced sample of the input signal.

18. The method of claim 16, wherein the first set of terms includes a non-linear term equal to a first delayed or advanced sample of the input signal multiplied by a signal envelope, the signal envelope based on a second delayed or advanced sample of the input signal to an exponential power of M.

19. The method of claim 18, further comprising providing the output signal to a power amplifier (PA), wherein M is determined based on a type of the PA.

20. The method of claim 16, further comprising:

determining a set of coefficients based on feedback from the output signal;

multiplying the second set of terms by a set of coefficients respectively; and combining results of the multiplications to produce the output signal.

* * * * *